United States Patent
Hung et al.

(10) Patent No.: US 9,530,900 B1
(45) Date of Patent: Dec. 27, 2016

(54) SCHOTTKY DIODE AND METHOD FOR MANUFACTURING THE SAME

(71) Applicant: VANGUARD INTERNATIONAL SEMICONDUCTOR CORPORATION, Hsinchu (TW)

(72) Inventors: Pei-Heng Hung, New Taipei (TW); Manoj Kumar, Dhanbad (IN); Chia-Hao Lee, New Taipei (TW); Chih-Cherng Liao, Jhudong Township (TW); Jun-Wei Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/006,579

(22) Filed: Jan. 26, 2016

(51) Int. Cl.
*H01L 29/78* (2006.01)
*H01L 29/872* (2006.01)
*H01L 29/66* (2006.01)

(52) U.S. Cl.
CPC ....... *H01L 29/872* (2013.01); *H01L 29/66143* (2013.01)

(58) Field of Classification Search
CPC .......................... H01L 29/872; H01L 29/66143
See application file for complete search history.

(56) References Cited

U.S. PATENT DOCUMENTS

| 5,818,084 A | 10/1998 | Williams et al. |
| 2012/0223383 A1 | 9/2012 | Tu et al. |

FOREIGN PATENT DOCUMENTS

| TW | 201114032 A1 | 4/2011 |
| TW | 201126715 A1 | 8/2011 |
| TW | 201238049 A1 | 9/2012 |

*Primary Examiner* — Long Pham
(74) *Attorney, Agent, or Firm* — Birch, Stewart, Kolasch & Birch, LLP

(57) ABSTRACT

A Schottky diode is provided, which includes a well of a first conductive type and a lightly doped region of a second conductive type on the well, wherein the first conductive type is opposite to the second conductive type. The Schottky diode includes a heavily doped region of the second conductive type on the well, and a gate structure on a part of the lightly doped region. The gate structure includes a gate electrode and a gate dielectric layer. The lightly doped region not covered by the gate structure and the heavily doped region are disposed at two opposite sides of the gate structure, respectively. The Schottky diode includes a first contact electrically connecting the heavily doped region and a first electrode, a second contact electrically connecting the gate electrode and a second electrode, and a third contact electrically connecting the lightly doped region and the second electrode.

14 Claims, 4 Drawing Sheets

SCHOTTKY DIODE AND METHOD FOR MANUFACTURING THE SAME

BACKGROUND

Technical Field

The disclosure relates to a Schottky diode, and in particular it relates to a structure of the Schottky diode and method for manufacturing the Schottky diode.

Description of the Related Art

A metal contacting a lightly doped semiconductor material may form a contact structure similar to a P-N junction (Schottky contact), which may serve as a Schottky diode. When a forward voltage is applied to the Schottky diode, a current will flow through the Schottky diode in the on state. When a reverse voltage is applied to the Schottky diode, the Schottky diode is in the off state. In an ideal case, the reverse current should be zero. In practice, the Schottky diode is not an ideal device, such that a little amount of reverse leakage current will flow through the Schottky diode in the off state. The reverse leakage current will negatively influence the performance and efficiency of the circuit. For lowering the reverse leakage current, the doping concentration of the lightly doped semiconductor material should be reduced. However, this will also lower the startup speed of the Schottky diode.

Accordingly, a novel Schottky diode having a reduced reverse leakage current without sacrificing startup speed is called for.

BRIEF SUMMARY

One embodiment of the disclosure provides a Schottky diode, comprising: a well of a first conductive type; a lightly doped region of a second conductive type on the well, wherein the first conductive type is opposite to the second conductive type; a heavily doped region of the second conductive type on the well; a gate structure on a part of the lightly doped region, wherein the gate structure includes a gate electrode and a gate dielectric layer, and the lightly doped region not covered by the gate structure and the heavily doped region are disposed at two opposite sides of the gate structure, respectively; a first contact electrically connecting the heavily doped region and a first electrode; a second contact electrically connecting the gate electrode and a second electrode; and a third contact electrically connecting the lightly doped region and the second electrode.

One embodiment of the disclosure provides a method for manufacturing a Schottky diode, comprising: forming a well of a first conductive type; forming a lightly doped region of a second conductive type on the well, wherein the first conductive type is opposite to the second conductive type; forming a gate structure on a part of the lightly doped region, wherein the gate structure includes a gate electrode and a gate dielectric layer; forming a heavily doped region of the second conductive type in a part of the lightly doped region and the well underlying the part of the lightly doped region, wherein the lightly doped region not covered by the gate structure and the heavily doped region are disposed at two opposite sides of the gate structure, respectively; forming a first contact to electrically connect the heavily doped region and a first electrode; forming a second contact to electrically connect the gate electrode and a second electrode; and forming a third contact to electrically connect the lightly doped region and the second electrode.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1A:
FIGS. 1A to 1H show cross sections of manufacturing a Schottky diode in one embodiment of the disclosure.

FIGS. 1A to 1H show cross sections of manufacturing a Schottky diode in one embodiment of the disclosure. As shown in FIG. 1A, a substrate 100 of a first conductive type is provided. In one embodiment, the substrate 100 can be silicon wafer or a silicon-on-insulator (SOI) wafer, and the first conductive type is p-type.

Figure 1B:
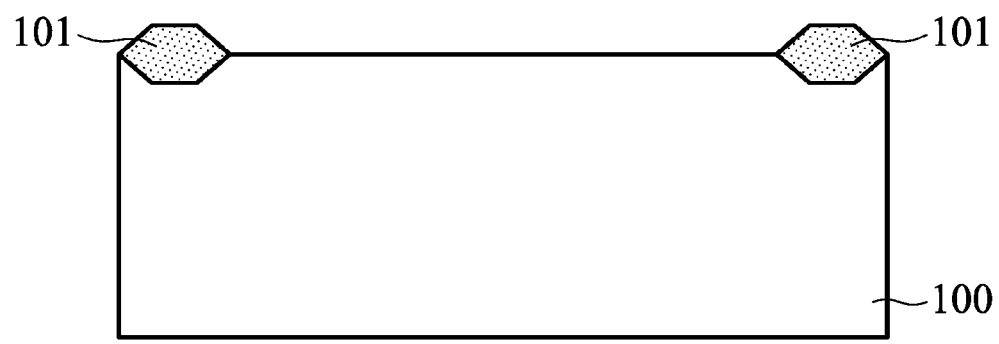

Subsequently, isolation structures 101 are formed to define a Schottky diode region between the isolation structure 101, as shown in FIG. 1B. The isolation structures 101 in FIG. 1B are local oxidation of silicon (LOCOS), which can be formed by, but are not limited to, the following steps: depositing a mask layer (e.g. silicon nitride) on the substrate 100, patterning the mask layer by lithography and etching to expose parts of the substrate 100, thermal oxidizing the exposed parts of the substrate 100 to form silicon oxide layers, and removing the patterned mask layer. The silicon oxide layers formed by the steps listed above are LOCOS. Alternatively, the isolation structures can be shallow trench isolation (STI) or middle trench isolation (MTI), which can be formed by, but are not limited to, the following steps: forming a mask layer on the substrate 100, patterning the mask layer by lithography and etching to expose parts of the substrate 100, etching the exposed parts of the substrate 100 to form trenches, filling the isolation material (e.g. silicon oxide) into the trenches, and removing the patterned mask layer.

Figure 1C:
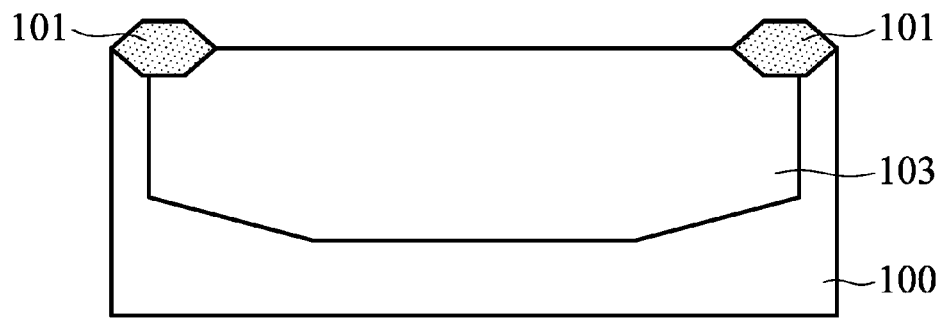

As shown in FIG. 1C, a well 103 of the first conductivity is then formed in the Schottky diode region. In one embodiment, the well 103 is p-type, and a method of forming the well 103 can be implanting a p-type dopant such as boron.

Figure 1D:
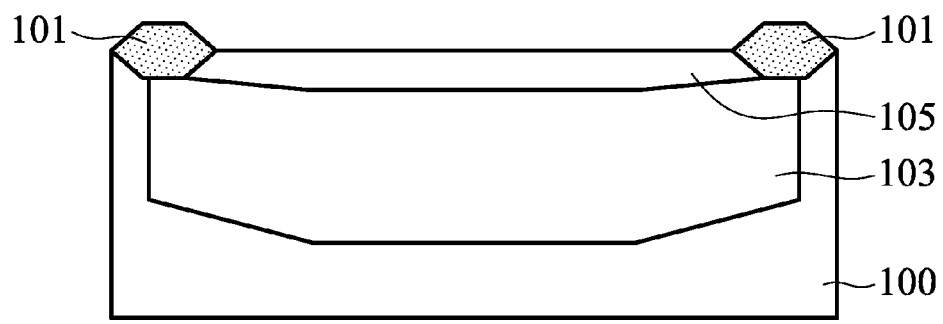

As shown in FIG. 1D, a lightly doped region 105 of a second conductive type is then formed at a surface of the Schottky diode region. The second conductive type is opposite to the first conductive type. In one embodiment, the lightly doped region 105 is n-type, and a method of forming the lightly doped region 105 can be implanting a n-type dopant such as phosphorous or arsenic. In one embodiment, the lightly doped region 105 has a doping concentration of 5.0E11 to 1.0E13.

Figure 1E:
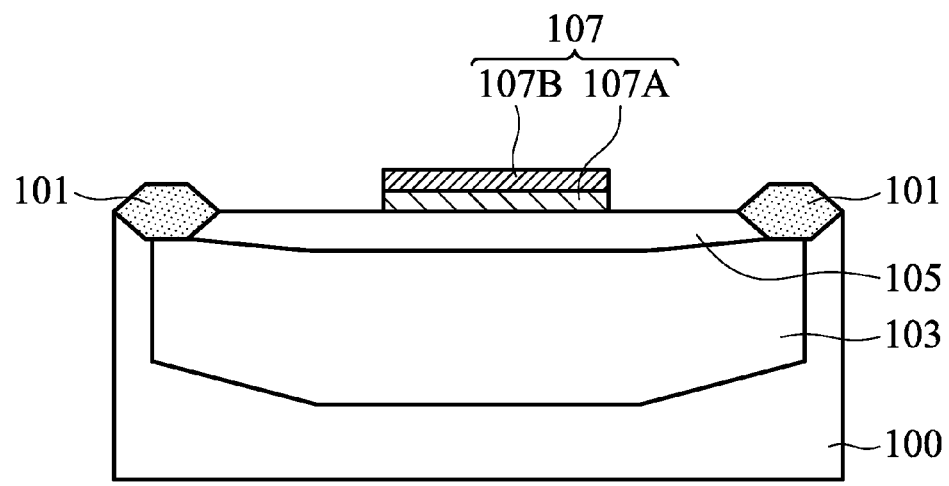

As shown in FIG. 1E, a gate structure 107 is then formed on a part of the lightly doped region 105. The gate structure 107 in FIG. 1E is located at the central portion of the Schottky diode region, but it can be located closer to some side other than be limited to the central portion in FIG. 1E. The gate structure 107 can be formed by, but are not limited to, the following steps: sequentially depositing a gate dielectric layer and a gate electrode layer, patterning the gate dielectric layer and the gate electrode layer by lithography and etching to define a gate dielectric layer 107A and a gate electrode 107B of the gate structure 107. The gate dielectric layer 107A can be silicon oxide, and the gate electrode 107B can be n-doped or undoped polysilicon. If the gate electrode 107B is n-doped polysilicon, the n-type dopant can be in-situ implanted during the depositing of the gate electrode layer.

Figure 1F:
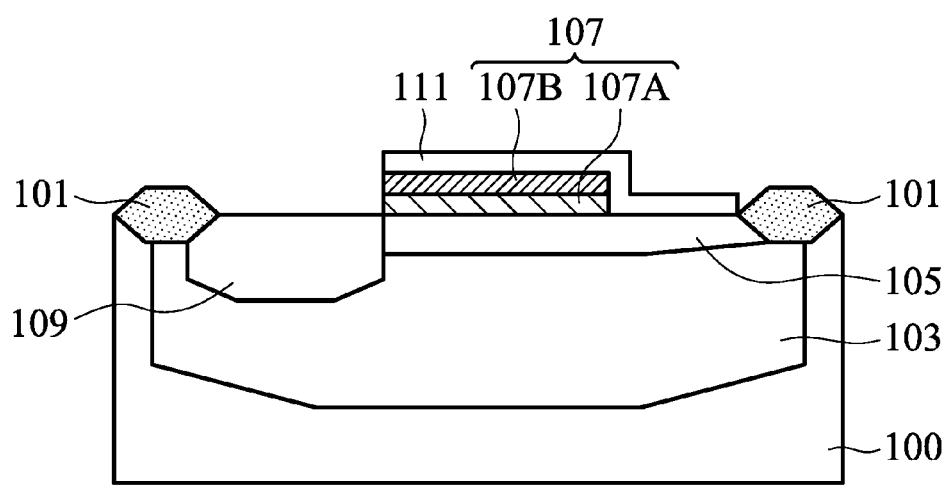

As shown in FIG. 1F, a middle doped region 109 of the second conductive type is formed at one side of the gate structure 107. In one embodiment, the middle doped region 109 is n-type, which can be formed by, but are not limited to, the following steps: forming a photoresist layer 111 on the gate structure 108 and the lightly doped region 105, patterning the photoresist layer 111 by lithography to expose a part of the lightly doped region 105 at one side of the gate structure 107 (and cover another part of the lightly doped region 105 at another side of the gate structure 107), and implanting the n-type dopant such as phosphorous or arsenic into the exposed lightly doped region 105 and the well 103 under the exposed lightly doped region 105. As shown in FIG. 1F, an interface between the middle doped region 109 and the lightly doped region 105 is aligned with a sidewall edge of the gate structure 107. In one embodiment, the middle doped region 109 has a higher doping concentration than that of the lightly doped region 105. For example, the middle doped region 109 has a doping concentration of 1.0E13 to 1.0E15.

Figure 1G:
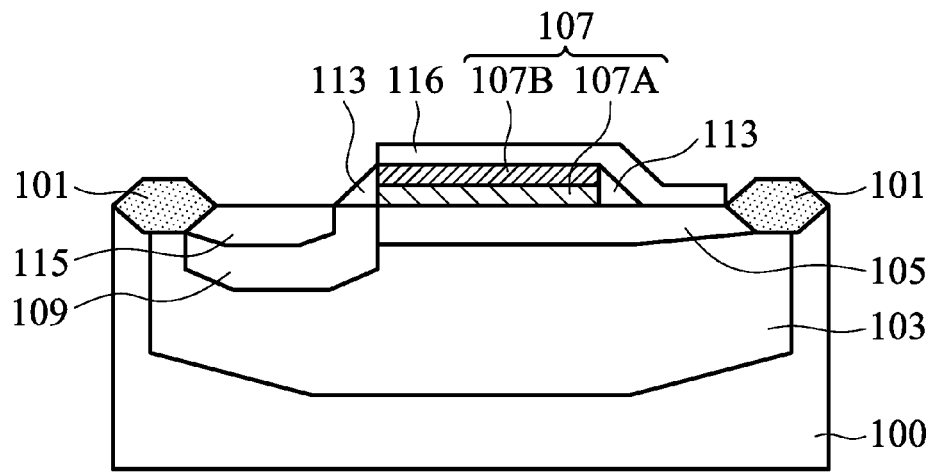

As shown in FIG. 1G, the photoresist layer 111 is then removed, and spacers 113 are formed on sidewalls of the gate structure 107 to cover a part of the middle doped region 109. The photoresist layer 111 can be removed by dry ashing, wet stripping, or a combination thereof. In one embodiment, the spacers 113 can be formed by, but are not limited to, the following steps: forming a spacer layer on the middle doped region 109, the gate structure 107, and the lightly doped region 105, and removing a part of the spacer layer by anisotropic etching to keep the spacers 113 on the sidewalls of the gate structure 107. In one embodiment, the spacers 113 can be silicon oxide, silicon nitride, silicon oxynitride, or a multi-layered structure thereof. A photo resist layer 116 is then formed to protect the lightly doped region 105, and a heavily doped region 115 of the second conductive type is then formed in the exposed middle doped region 109. In one embodiment, the heavily doped region 115 is n-type, which can be formed by, but are not limited to, the following steps: implanting the n-type dopant such as phosphorous or arsenic into the exposed middle doped region 109. As shown in FIG. 1G, an interface between the heavily doped region 115 and the middle doped region 109 is aligned with an edge of the spacer 113. In one embodiment, the heavily doped region 115 has a doping concentration higher that of the middle doped region 109. For example, the heavily doped region 115 has a doping concentration of 5.0E14 to 7.0E15.

Figure 1H:
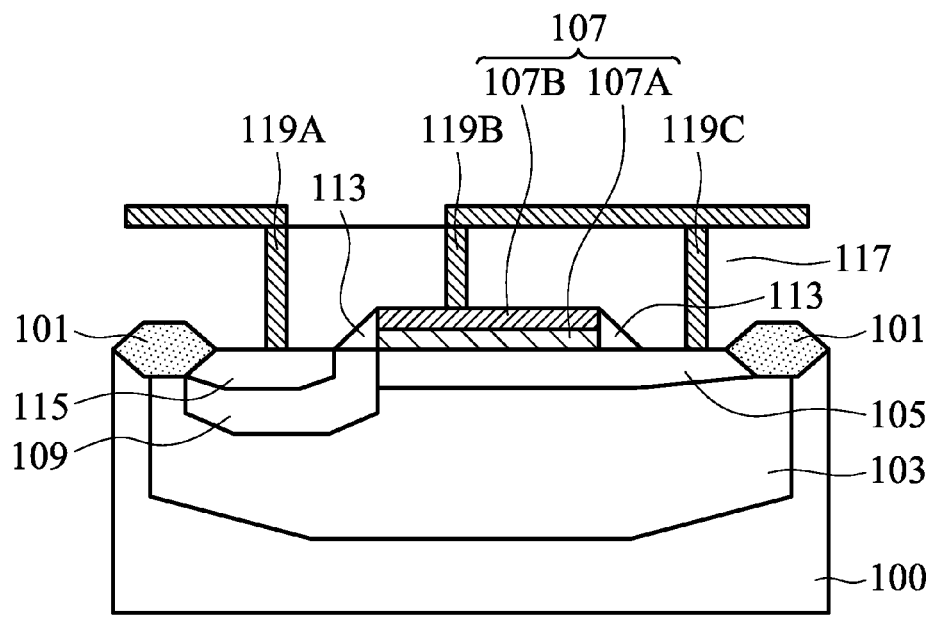

As shown in FIG. 1H, the photoresist layer 116 is then removed, and an ILD (inter-layered dielectric) layer 117 is formed on the heavily doped region 115, and contacts 119A, 119B, and 119C are formed to contact the heavily doped region 115, the gate electrode 107B, and the lightly doped region 105, respectively. The photoresist layer 116 can be removed by dry ashing, wet stripping, or a combination thereof. The contact 119A connects to a first electrode (e.g. cathode), and the contacts 119B and 119C connect to a second electrode (e.g. anode). As such, a Schottky diode is completed. In one embodiment, the contacts 119A, 119B, and 119C can be formed by, but are not limited to, the following steps: forming a mask layer on the ILD layer 117, patterning the mask layer by lithography and etching to expose parts of the ILD layer 117, etching and removing the exposed parts of the ILD layer 117 to form via holes for exposing parts of the heavily doped region 115, the gate electrode 107B, and the lightly doped region 105, and filling a conductive material into the via holes to form the contacts 119A, 119B, and 119C. The conductive material can be metal such as tungsten, copper, silver, gold, the like, or an alloy thereof. The conductive material can be formed by sputtering, electroplating, or any other suitable method.

Because the second electrode simultaneously electrically connects to the gate electrode 107B and the lightly doped region 105, the voltage applied to the gate electrode 107B through the contact 119B may switch on the lightly doped region 105 under the gate structure 107 (serving as a channel), such that the voltage applied to the lightly doped region 105 through the contact 119C may fast pass through the lightly doped region 105 under the gate structure 107. As such, the Schottky diode needs a shorter operating time. On the other hand, the above structure may utilize a lightly doped region with a lower doping concentration to avoid the reverse leakage current, and the gate structure 107 may prevent a problem caused by the lower doping concentration of the lightly doped region (e.g. elongating the operating time of the Schottky diode). In short, the Schottky diode simultaneously includes such advantages as a fast operating speed and a low leakage current.

As shown in FIG. 1H, the lightly doped region 105 not covered by the gate structure 107 and the heavily doped region 115 are disposed at two opposite sides of the gate structure 107, respectively, for achieving the above advantages. Alternatively, the gate structure 107 and the lightly doped region 105 have an overlapping length of 0.3 μm to 1.0 μm. An overly long overlapping length may increase the operating time of the Schottky diode. An overly short overlapping length may result in a leakage current problem.

In above embodiment, the substrate 100 and the well 103 are p-type, the lightly doped region 105, the middle doped region 109, and the heavily doped region 115 are n-type, the first electrode is a cathode, and the second electrode is an anode. Alternatively, the substrate 100 and the well 103 are n-type, the lightly doped region 105, the middle doped region 109, and the heavily doped region 115 are p-type, the first electrode is a cathode, and the second electrode is an anode.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A Schottky diode, comprising:
a well of a first conductive type;
a lightly doped region of a second conductive type on the well, wherein the first conductive type is opposite to the second conductive type;
a heavily doped region of the second conductive type on the well;
a gate structure on a part of the lightly doped region, wherein the gate structure includes a gate electrode and a gate dielectric layer, and the lightly doped region not covered by the gate structure and the heavily doped region are disposed at two opposite sides of the gate structure, respectively;

a first contact electrically connecting the heavily doped region and a first electrode;
a second contact electrically connecting the gate electrode and a second electrode; and
a third contact electrically connecting the lightly doped region and the second electrode.

2. The Schottky diode as claimed in claim 1, wherein the first conductive type is p-type, and the second conductive type is n-type.

3. The Schottky diode as claimed in claim 1, wherein the first conductive type is n-type, and the second conductive type is p-type.

4. The Schottky diode as claimed in claim 1, wherein the heavily doped region has a doping concentration higher than that of the lightly doped region.

5. The Schottky diode as claimed in claim 1, wherein the gate structure and the lightly doped region have an overlapping length of 0.3 µm to 1 µm.

6. The Schottky diode as claimed in claim 1, further comprising:
a spacer on a sidewall of the gate structure; and
a middle doped region of the second conductivity,
wherein the heavily doped region is located in the middle doped region, a part of the middle doped region is disposed between the heavily doped region and the lightly doped region, an interface between the heavily doped region and the middle doped region is aligned with an edge of the spacer, and an interface between the middle doped region and the lightly doped region is aligned with an edge of the gate structure.

7. The Schottky diode as claimed in claim 6, wherein the heavily doped region has a doping concentration higher than that of the middle doped region, and the middle doped region has a doping concentration higher than that of the lightly doped region.

8. A method for manufacturing a Schottky diode, comprising:
forming a well of a first conductive type;
forming a lightly doped region of a second conductive type on the well, wherein the first conductive type is opposite to the second conductive type;
forming a gate structure on a part of the lightly doped region, wherein the gate structure includes a gate electrode and a gate dielectric layer;
forming a heavily doped region of the second conductive type in a part of the lightly doped region and the well underlying the part of the lightly doped region, wherein the lightly doped region not covered by the gate structure and the heavily doped region are disposed at two opposite sides of the gate structure, respectively;
forming a first contact to electrically connect the heavily doped region and a first electrode;
forming a second contact to electrically connect the gate electrode and a second electrode; and
forming a third contact to electrically connect the lightly doped region and the second electrode.

9. The method as claimed in claim 8, wherein the first conductive type is p-type, and the second conductive type is n-type.

10. The method as claimed in claim 8, wherein the first conductive type is n-type, and the second conductive type is p-type.

11. The method as claimed in claim 8, wherein the heavily doped region has a doping concentration higher than that of the lightly doped region.

12. The method as claimed in claim 8, wherein the gate structure and the lightly doped region have an overlapping length of 0.3 µm to 1 µm.

13. The method as claimed in claim 8, further comprising:
forming a spacer on a sidewall of the gate structure; and
forming a middle doped region of the second conductivity,
wherein the heavily doped region is located in the middle doped region, a part of the middle doped region is disposed between the heavily doped region and the lightly doped region, an interface between the heavily doped region and the middle doped region is aligned with an edge of the spacer, and an interface between the middle doped region and the lightly doped region is aligned with an edge of the gate structure.

14. The method as claimed in claim 13, wherein the heavily doped region has a doping concentration higher than that of the middle doped region, and the middle doped region has a doping concentration higher than that of the lightly doped region.

* * * * *